INVENTOR.
WEN YUAN PAN
BY J. L. Whittaker
ATTORNEY 3,272,996
SIGNAL LIMITER

Wen Yuan Pan, Haddon Heights, N.J., assignor to Radio Corporation of America, a corporation of Delaware Filed Dec. 31, 1959, Ser. No. 863,132
10 Claims. (Cl. 307—88.5)

This invention relates generally to improved methods of and means for signal translation, and particularly to improved methods of and means for utilizing negative conductance semiconductor diodes for signal limiting.

Signal limiters are often employed to limit signal amplitudes to prevent overloading, crossmodulation or distortion in signal receivers for frequency-modulated carrier waves. They are also useful in input circuits of radar receiver circuits to prevent damage to the mixer from the transmitter "main bang" or from strong nearby target echo signals.

An early form of such negative conductance diodes is described by Leo Esaki in Physical Review, vol. 109, page 603 (1958).

A particular form of such a negative conductance diode especially useful with the instant invention is known as a tunnel diode. Such tunnel diodes are semiconductor devices employing a very thin, or abrupt, p-n junction, the transition region from p-type conductivity to n-type conductivity preferably being less than 200 A. In preferred types of tunnel diodes, the semiconductor has a moderate band-gap and both sides of the p-n junction are doped (i.e., contain conductivity-type-determining impurities) almost to the point where the semiconductor becomes polycrystalline, in order to provide a very high concentration of free charge carriers. Such diodes conduct current in the forward direction by two processes: at low voltages conduction is principally by quantum mechanical tunneling of charge carriers through the depletion region of the p-n junction. Such current due to tunneling rises rapidly to a maximum and then falls to zero over a short range of forward bias voltage, generally less than 1 volt, and provides the negative conductance characteristic. At higher voltages the current is due to charge carriers passing over the barrier of the p-n junction.

Thus a tunnel diode exhibits a positive resistance characteristic for very small forward bias voltages, a negative resistance characteristic for intermediate values of forward bias voltages, and a positive resistance for higher values of forward bias voltages. Stated in another manner, as the forward voltage applied to a voltage controlled negative resistance diode is continuously increased from zero, the diode current first increases to a relatively sharp maximum value, then decreases to a relatively deep and broad minimum, and thereafter again increases. For presently known types of negative resistance germanium diodes, an exemplary voltage range over which the diode exhibits a negative resistance characteristic is from 50 to 350 millivolt (mv.). The negative resistance of the diode, which is the reciprocal negative slope of its current-voltage characteristic, depends on the nature of the junction of the diode.

It is an object of the present invention to utilize the afore-mentioned characteristics of negative conductance semiconductive diodes such as tunnel diodes to provide improved methods of and means for limiting the amplitudes of signals applied thereto.

Another object of the invention is to provide improved methods of and means for employing semiconductor diodes, such as, for example, tunnel diodes as dynamically controllable signal limiters.

A further object of the invention is to provide improved methods of and means for employing tunnel diodes in signal transmission circuits in a manner whereby signals having amplitudes below a predetermined value are transmitted substantially without attenuation, and signals having amplitudes above said value are attenuated substantially to said value.

An additional object is to provide improved methods of and means for employing tunnel diodes as signal limiters in the "head-end" radio frequency circuits of radar, frequency modulation, amplitude modulation, and video receivers, as well as in intermediate frequency or other circuit requiring signal limiting.

A further object is to provide an improved method of and means for signal limiting wherein the limiting amplitude level is dynamically responsive to the applied signal amplitude.

The afore-mentioned and other objects and advantages can be accomplished in accordance with the invention by means of a tunnel diode shunted across a signal transmission circuit, and wherein the tunnel diode is initially biased to a selected value on its negative resistance characteristic, the diode also being shunted by a positive load resistance of a somewhat lower value than the minimum value of the diode negative resistance. In a preferred embodiment of the invention, the load resistance is selected to be as close as possible, but lower than the minimum value of the diode negative resistance in the absence of applied signals. Under such conditions the power gain of the circuit is at a maximum but less than unity. In very small signals, the average negative resistance of the tunnel diode is not charged appreciably and the power gain remains near its maximum. For stronger signals, the average negative resistance increases, and the power gain of the circuit is somewhat reduced. The peaks of very strong signals drive the tunnel diode into its low positive resistance regions, and are severely attenuated. Signals having peak amplitudes within the voltage range of the diode negative resistance characteristic receive substantially no attenuation, since the diode effectively presents a high shunt impedance to the transmission circuit. However, for signals having peak amplitudes exceeding the voltage range width of the negative resistance region, the diode provides signal rectification which effectively increases the bias potential applied to the diode, causing the diode to operate in its positive resistance region which thereby presents a low impedance shunt to the signal transmission circuit with resulting signal attenuation. In addition, a separate AGC circuit responsive to signal amplitudes in the same or other signal transmission circuits may be employed to additionally control the diode bias voltage for additional dynamic limiting action. Such an AGC can apply either an additional D.-C. bias voltage, or a regenerative or a degenerative signal voltage, as desired, for effectively controlling the voltage range of input signals which will not be substantially attenuated.

The invention will be described in greater detail by reference to the accompanying drawing wherein similar reference characters are applied to similar elements and wherein.

A typical diode which could be used in practicing the invention includes a single crystal of $10^{-3}$ ohm-cm. n-type germanium which is doped with arsenic to have a donor atomic concentration of $4.0 \times 10^{19}$ cm.$^{-3}$, with a rectifying junction formed by alloying thereto a minute dot of 99% indium, .5% gallium, and .5% zinc by weight, by methods known in the semiconductor art, which may be accomplished, for example, as described by H. S. Sommers, Jr., in Proceedings of the I.R.E., Volume 47, No. 7, July 1959 at pages 1201 to 1206 inclusive.

A typical semiconductor device, prepared according to the example, exhibits the following characteristics:

$\overline{R}$=8.5 ohm (Ω)
$C$=270 micromicrofarads (μμf.)
$\overline{RC}$=2.295 millimicroseconds (mμ's).

Where $\overline{R}$ is the average value of the negative resistance from current maximum to current minimum; C is the capacitance of the junction at the operating point of the diode; and $\overline{RC}$ is the approximate time constant determining the frequency characteristic of the diode.

Figure 1:
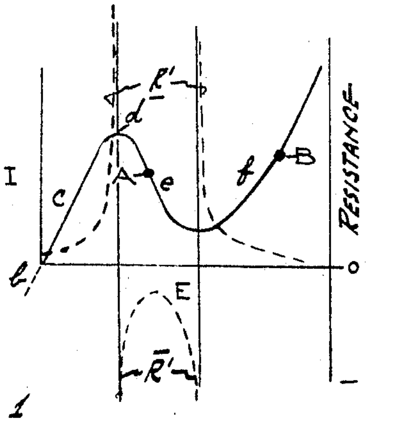
FIG. 1 is a graphic illustration of the voltage-current operating characteristic of a typical semiconductive tunnel diode operated in accordance with the invention.

The current-voltage characteristic of such a typical diode suitable for use with circuits embodying the invention is shown in FIGURE 1. The current scales depend on area and doping of the junction, but representative currents are in the milliampere range.

For a small voltage in the back direction, the back current of the diode increases as a function of voltage as is indicated by the region *b* of FIGURE 1.

For small forward bias voltages, the characteristic is substantially symmetrical (FIGURE 1, region *c*). The initial forward current is due to quantum mechanical tunneling. At higher forward bias voltages, the forward current due to tunneling reaches a maximum (region *d*, FIGURE 1), and then begins to decrease. This drop continues (FIGURE 1, region *e*) until eventually normal injection over the barrier becomes important and the characteristic turns into the useful forward behavior (region *f*, FIGURE 1).

The negative resistance $\overline{R}'$ of the diode is the incremental change in voltage divided by the incremental change in current, or the reciprocal slope of the region *e* of FIGURE 1. To bias the diode for stable operation in the negative resistance region *e* of its characteristic requires a suitable voltage source having a smaller internal impedance than the negative resistance of the diode. The variations of positive resistance $\underline{R}'$ and negative resistance R' of the diode, as functions of diode bias voltage, are typified by the dash line curves $\underline{R}'$ and $\overline{R}'$, respectively.

Figure 2:
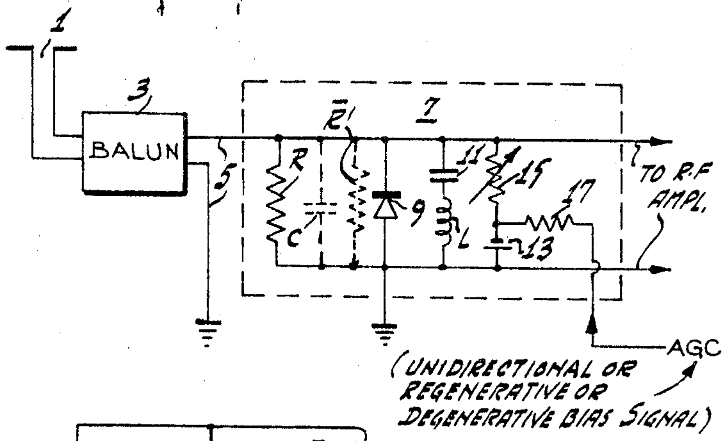
FIG. 2 is a partially block, schematic circuit diagram of a first embodiment of the invention useful in the "head end" radio frequency circuits of a radio receiver.

Referring to FIG. 2, an embodiment of the invention, especially useful in the radio frequency "head-end" portion of a VHF or UHF radio receiver, for example, includes a tunnel diode signal limiter circuit in shunt with a signal transmission circuit connecting the antenna circuit to the input circuit of the first radio frequency amplifier stage (not shown).

The balanced antenna 1 is coupled through a balun 3 to provide an unbalanced transmission circuit 5, having a characteristic impedance, for example, of about 75 ohms, connected to the input circuit of the first radio frequency amplifier (not shown).

The input signal amplitude to conventional R.-F. amplifiers generally should not exceed about 0.1 to 1.0 volt, depending upon circuit limitations, for acceptable cross-modulation or distortion limits. When tunnel diodes are employed as R.-F. amplifiers, the maximum tolerable input signal is even further reduced. Since input signal levels vary over wide limits in different locations it has been customary to employ relatively expensive and bulky tapped attenuators in the input circuit which can be manually adjusted to provide the desired input signal level. Because of size and cost considerations and convenience in operation, it is highly preferable to employ simple electronic means dynamically responsive to signal level for limiting or otherwise controlling the maximum input signal level applied to the input amplifier.

In accordance with a preferred embodiment of the invention, a tunnel diode signal limiter circuit 7 is connected in shunt with the signal transmission circuit 5. The limiter circuit 7 includes a tunnel diode 9 having an effective capacitance C and a minimum negative resistance of $\overline{R}'$ (both shown as dash line elements in parallel with the diode). The diode capacitance C is resonated to the input frequency range by an inductance L and blocking capacitor 11 connected in parallel therewith. If the receiver covers a wide frequency band, as in a multichannel television set, the inductance may be varied in synchronism with other tuning elements of the receiver.

A unidirectional bias voltage, for biasing the diode to a desired point A on the negative resistance portion *e* of its voltage-current characteristic, is derived from a battery or other source 13 connected through a series resistor 15. Preferably the diode should be biased, in the absence of applied signals, to the inflection point of the negative resistance portion of the operating characteristic, whereat the value of the negative resistance is a minimum as shown by the portion of the dash line curve $\overline{R}'$ in FIG. 1 that is closest to the abscissa.

The positive load resistance R in shunt with the diode 9 is selected to have an absolute value preferably just slightly lower than the minimum negative resistance $\overline{R}'$ of the diode where $\overline{R}'$ is expressed as the absolute value and the negative value is $-\overline{R}'$. When so selected the diode circuit will neither provide any net gain nor oscillate, but will present a dynamically variable shunt impedance across the signal transmission circuit 5.

Figure 3:
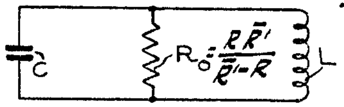
FIG. 3 is a schematic equivalent circuit diagram of a tunnel diode operated in accordance with the invention.

The equivalent circuit of the diode circuit is shown in FIG. 3 wherein:

$$R_0 = \frac{R\overline{R}'}{\overline{R}' - R} \qquad (1)$$

Thus when $R = 0.9\overline{R}'$, $R_0 = 9\overline{R}'$ and when $R = 0.99\overline{R}'$, $R_0 = 99\overline{R}'$ Therefore, input signals having amplitudes below levels which would drive the diode into its positive resistance condition would not be attenuated by the effectively high shunt impedance presented by the diode circuit.

However, when input signal levels exceed a value which drives the diode well into its positive resistance condition, the diode rectifies the signal to provide a D.-C. component which is superimposed on the initial bias voltage to bias the diode to, for example, the point B on the characteristic of FIG. 1. Under this latter condition the diode resistance is a low positive value (see curve $\underline{R}'$) and $R_0$ is smaller than either R or $\underline{R}'$, whereby the signal is heavily attenuated.

For extremely wide variations in the amplitudes of applied signals additional dynamic control of the signal limiting action of the diode may be desirable. If desired, an AGC voltage may be derived in any conventional manner from some subsequent circuit in the receiver and applied to the diode 9 through an isolating resistor 17 connected to the diode bias voltage resistor 15.

Alternatively, either regenerative or degenerative signal voltage may be derived from subsequent receiver circuits in any conventional manner and applied to the diode through said isolating resistor 17. Such signals applied degeneratively to the diode would provide additional dynamic signal limiting. If such signals were applied regeneratively to the diode, very weak input signals would be effectively amplified, while still providing effective limiting for input signals exceeding a selected level. Thus the signal amplitude level at which effective signal limiting occurs may be determined not only by the electrical characteristics of the diode and its associated load resistance, but also by the magnitude and phasing of AGC or feed back signals derived from other circuits of the receiver and superimposed on the diode bias voltage.

Figure 4:
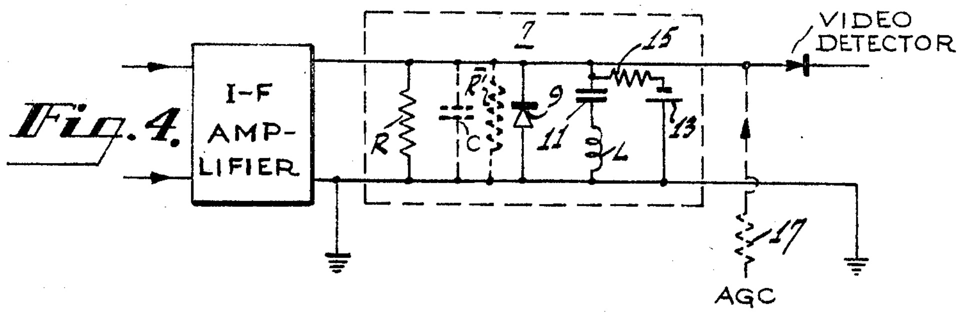
FIG. 4 is a partially block, schematic circuit diagram of a second embodiment of the invention useful, for example, as an intermediate frequency limiter suitable for use in a frequency-modulation receiver.

FIGURE 4 shows an embodiment of the invention wherein the signal limiter is inserted between the intermediate-frequency amplifier and the video detector of a typical television or radar receiver. The diode limiter circuit 7 is similar to that described by reference to FIGS. 1–3, except that the AGC signals, if employed, are applied through the isolating resistor 17 directly to the diode 9 instead of through the bias circuit resistor 15. Either arrangement may be employed. Since relatively high signal levels, of the order of several volts, may be applied to the video detector, the type of AGC or degenerative feedback signals applied to the isolating resistor 17 will depend upon associated circuit considerations and the degree of dynamic limiting required.

I claim:

1. A signal limiting circuit comprising a semiconductor tunnel diode having an operating characteristic with positive conductance and negative conductance portions, means for applying signals to said diode, means for biasing said diode to operate at a selected negative conductance value in the absence of applied signals, resistive means effectively coupled in parallel with said diode, said resistive means having a resistance value relative to that of the negative resistance of said diode to present in combination with said diode a high shunt positive impedance to said applied signals having an amplitude below a selected value and to attenuate said applied signals above said selected value substantially to said selected value, and automatic gain control means coupled to said diode for changing the bias applied to said diode as a function of the amplitude of the signals applied to said diode.

2. A signal limiting circuit comprising a voltage controlled semiconductor tunnel diode having an operating characteristic with positive conductance and negative conductance portions, shunt connected means for applying signals to said diode, means for biasing said diode to operate at a selected negative conductance value in the absence of applied signals, resistive means effectively coupled in parallel with said diode, said resistive means having a resistance value relative to that of the negative resistance of said diode to present in combination with said diode a high shunt positive impedance to said applied signals having an amplitude below a selected value and to limit said applied signals above said selected value substantially to said selected value, and automatic gain control means coupled to said diode for changing the bias applied to said diode as a function of the amplitude of the signals applied to said diode.

3. A signal limiting circuit comprising a voltage controlled semiconductor tunnel diode having an operating characteristic with positive conductance and negative conductance portions, means coupled in shunt to said diode for applying signals to said diode, means for loading said diode to prevent oscillation, means for biasing said diode to operate at a selected negative conductance value and automatic gain control means coupled to said diode for changing the bias applied to said diode as a function of the amplitude to the signals applied to said diode.

4. A signal limiting circuit comprising a voltage controlled semiconductor tunnel diode having an operating characteristic with positive conductance and negative conductance portions, means for applying signals in shunt to said diode, means for biasing said diode to operate at a selected negative conductance value in the absence of applied signals, resistive means effectively coupled in parallel with said diode, said resistive means having a resistance value less than the absolute value of minimum negative resistance of said diode to provide in combination with said diode substantially no attenuation to said signals below an amplitude value determined by said selected negative conductance value and responsive to amplitudes of said signals exceeding said amplitude value determined by said selected negative conductance value for changing said biasing of said diode to operate at a positive conductance portion of said characteristic to attenuate said applied signals, and automatic gain control means coupled to said diode for changing the bias applied to said diode as a function of the amplitude of the signals applied to said diode.

5. A dynamically controlled signal circuit comprising a tunnel diode, means for biasing said diode to operate at a selected point on the negative resistance portion of its operating characteristic in the absence of applied signals, means for applying to said diode signals to be limited, and automatic gain control means responsive to the amplitude of said signals for changing the biasing of said diode effectively to operate said diode at a different point on said operating characteristic.

6. A circuit as claimed in claim 5 wherein said signal responsive means provides a unidirectional bias voltage to said diode.

7. A circuit as claimed in claim 5 wherein said signal responsive means applies said signals regeneratively to said diode.

8. A circuit as claimed in claim 5 wherein said signal responsive means applies said signals degeneratively to said diode.

9. A signal limiting circuit comprising a voltage controlled semiconductor tunnel diode having an operating characteristic with positive conductance and negative conductance portions, means coupled in shunt to said diode for applying signals to said diode, means for loading said diode to prevent oscillation, means for biasing said diode to operate at a selected negative conductance value, and automatic gain control means coupled to said diode for changing the bias applied to said diode as a function of the amplitude of the signal applied to said diode, said loading means comprising a resistance having a value of more than one-half and less than the absolute value of the lowest negative resistance of said diode.

10. A voltage sensitive attenuating circuit comprising: a tunnel diode device exhibiting a negative resistance region in the low forward voltage range of its current-voltage characteristic; bias means coupled to said tunnel diode device establishing a direct current load line therefor which has a single intersection with said current-voltage characteristic; means for impressing a selected input signal across said tunnel diode device; a load impedance having a maximum value less than the absolute value of said tunnel diode negative resistance connected across said tunnel diode device; and means for coupling a control signal to said tunnel diode device for varying the bias thereon and the gain of said circuit.

References Cited by the Examiner

UNITED STATES PATENTS

| | | | |
|---|---|---|---|
| 2,144,995 | 1/1939 | Pulvari-Pulvermacher. | |
| 2,565,497 | 8/1951 | Harling | 307—88.5 |
| 2,835,867 | 5/1958 | Golden. | |
| 3,119,080 | 1/1964 | Watters | 332—52 |

FOREIGN PATENTS

| | | |
|---|---|---|
| 158,879 | 9/1954 | Austria. |
| 413,383 | 7/1934 | Great Britain. |

OTHER REFERENCES

Article by Sommers et al., IRE Wescon Convention Record, Part 3, Electron Devices, August 1959, pages 3–8.

Sommers, "Tunnel Diodes as High-Frequency Devices," Proceedings of the IRE. July 1959, pages 1201–1206.

Lesk et al., "Germanium and Silicon Tunnel Diodes, Design, Operation and Application, IRE Wescon Convention, Part 3, Electron Devices, August 1959, pages 9–31, TK6541 155W.

ROY LAKE, *Primary Examiner.*

GEORGE N. WESTBY, *Examiner.*

J. W. CALDWELL, A. L. BRODY, *Assistant Examiners.*